(12) United States Patent
Lin

(10) Patent No.: US 12,429,499 B2
(45) Date of Patent: Sep. 30, 2025

(54) PROBE HEAD, PROBE ASSEMBLY AND SPRING PROBE STRUCTURE INCLUDING THE SAME

(71) Applicant: AZOTH STUDIO LTD. CO., Zhubei (TW)

(72) Inventor: Zhou Yi Lin, Zhubei (TW)

(73) Assignee: AZOTH STUDIO LTD. CO., Zhubei (TW)

( * ) Notice: Subject to any disclaimer, the term of this patent is extended or adjusted under 35 U.S.C. 154(b) by 204 days.

(21) Appl. No.: 18/243,029

(22) Filed: Sep. 6, 2023

(65) Prior Publication Data
US 2024/0085455 A1    Mar. 14, 2024

(30) Foreign Application Priority Data
Sep. 13, 2022 (TW) ................... 111134569

(51) Int. Cl.
*G01R 1/067* (2006.01)
(52) U.S. Cl.
CPC ..... *G01R 1/06722* (2013.01); *G01R 1/06733* (2013.01); *G01R 1/06755* (2013.01)
(58) Field of Classification Search
CPC ............ G01R 1/06722; G01R 1/06733; G01R 1/06755
See application file for complete search history.

(56) References Cited

U.S. PATENT DOCUMENTS

| | | | | |
|---|---|---|---|---|
| 4,397,519 A * | 8/1983 | Cooney | ............... | H01R 13/2421 324/755.05 |
| 4,918,384 A * | 4/1990 | Giringer | ................ | H01R 11/18 324/755.05 |
| 6,674,297 B1 * | 1/2004 | Florence, Jr. | ...... | G01R 1/06722 324/754.13 |
| 2007/0018666 A1 * | 1/2007 | Barabi | ............... | G01R 1/06722 324/755.05 |
| 2007/0296436 A1 * | 12/2007 | Winter | ............... | G01R 1/06733 324/755.05 |
| 2008/0048701 A1 * | 2/2008 | Henry | ................ | G01R 1/06722 324/755.05 |
| 2009/0261851 A1 * | 10/2009 | Zhou | .................. | H01R 13/2492 324/755.05 |
| 2013/0099811 A1 * | 4/2013 | Lee | .................... | G01R 1/06722 324/754.11 |
| 2014/0320158 A1 * | 10/2014 | Hsiao | ................ | G01R 1/06722 324/755.01 |

OTHER PUBLICATIONS

Translation of JP 2012-122905 A (Year: 2012).*

* cited by examiner

*Primary Examiner* — Paresh Patel

(57) ABSTRACT

Provided are a probe head, a probe assembly and a spring probe including the same. The probe head comprises a contact portion and first, second and third body portions stacked in sequence; the contact portion has a size decreasing in a direction away from the first body portion, the contact portion is for contacting an object to be tested; the first body portion has a radial size greater than the second and third body portions; the second body portion is surrounded by a second concave wall and a second boundary wall; the third body portion has a radial size not greater than the second boundary wall and larger than a smallest radial size of the second concave wall; the probe assembly includes the probe head and a pipe having a portion protruding into the second concave wall, thereby achieving easy assembly and good firmness of the pipe and the probe head.

26 Claims, 17 Drawing Sheets

PROBE HEAD, PROBE ASSEMBLY AND SPRING PROBE STRUCTURE INCLUDING THE SAME

CROSS-REFERENCE TO RELATED APPLICATION

This application claims the priority of Taiwanese patent application No. 111134569, filed on Sep. 13, 2022, which is incorporated herewith by reference.

SUMMARY OF THE INVENTION

1. Field of the Invention

The present invention relates to the technical field of a probe for electrical testing, and more particularly, to a probe head design that adopts micro-electromechanical process to fabricate a special structural shape so as to form a micro-electromechanical probe head with multi-layer structure which has larger attachment area and high bonding strength, and a probe assembly including the same.

2. The Prior Arts

After wafers have been produced through a semiconductor process, it is necessary to check whether the signal transmission can operate or be computed normally through electrical contact, so as to determine the quality of numerous dies. In general, in order to check whether the electrical connection of the die circuit is correct, or whether there is a problem in signal transmission, a probe is usually used as the testing interface between the testing device and the chip to be tested, thereby obtaining the testing result of the die to be tested through signal transmission and electrical signal analysis.

In some applications, the test of the probe device is not carried out on a planar structure, such as a contact pad, but on a three-dimensional contact structure, which has a ball shape of conductive material referred as a bump or a metal pillar (especially copper) referred as a boss, protruding from a surface of an object to be tested. For application in the above testing operations, a more preferred solution is to use a spring probe.

The probe is the main component responsible for electrical contact in the test operation. As the number of dies distributed in the wafer continuously increases, the gap between adjacent dies is continuously reduced, and the probe size is also continuously required to be reduced. In the conventional example of FIG. 1, the probe head 91 is manufactured by a micro-electromechanical process and has a structure comprising a contact portion 911, a first main body portion 912, a second main body portion 913 and a third main body portion 914, with the contact portion 911 being a protruding tip. However, such probe head 91 manufactured by a micro-electromechanical process is in a multi-layer planar stacked structure, which is formed by stacking vertically in sequence using semiconductor processes, but the stack must be increased to a certain height to reduce the difficulty of assembly, so as to be beneficial to be combined with structures such as the metal housing 90, the spring 93, and the plunger 92 to form a spring probe. The size of the spring probe is reduced as the gap for the wafer testing is reduced, therefore, the size of the micro-electromechanical probe head is also required to be reduced. However, such probe head manufactured by a micro-electromechanical process is in a multi-layer planar structure, which is formed by vertical stacking. More specifically, multiple processes such as pattern transfer process, pattern development process, metal deposition process, grinding and planarization process, and chemical etching process are needed for each layer of planer structure. When the fabrication of one layer of planar structure is completed, a next layer of planar structure is fabricated in a vertical stacking manner. Therefore, the structural strength of the micro-electromechanical probe head is the sum of the bonding strength between each planar structure and its upper and lower planar structures. And the key factor affecting the bonding strength is the attachment area between the planar structures. When the attachment area is larger, the bonding strength between the planar structures is stronger. On the contrary, when the attachment area is smaller, the bonding strength is weaker. Taking FIG. 1 as an example, the first body portion 913 has an outer diameter less than those of the middle portion 912 and the second body portion 914, such that the bonding strength between this layer and other layers is relatively weak. However, if the bonding strength of any layer of the planar structure is not enough, it may cause the structure separation of the micro-electromechanical probe head. In addition, the firm space between the miniaturized micro-electromechanical probe head and the component is also relatively reduced, which increases the difficulty of processing and assembly, because in addition that the probe needs to have high current transmission, during the testing operation of repeated electrical contact and electrical separation, the structural strength of the micro-electromechanical probe head and the firmness between the probe head and other components must also be maintained. Therefore, how to achieve the high structural strength of the micro-electromechanical probe head and how to ensure the excellent firmness of the finished product during the processing and assembly are the focus in research and design of the present invention.

BACKGROUND OF THE INVENTION

A main objective of the present invention is to provide a micro-electromechanical probe head with an inward concave structural design and a probe assembly including the same. This structural design provides a larger attachment area of the planar structure of the micro-electromechanical probe head, which can improve the bonding strength between the planar structures, and provides better structural strength for the micro-electromechanical probe head, a more convenient assembly of the micro-electromechanical probe head and the pipe, and good firmness after assembly. After the spring probe is made, the components will not be separated from each other after the probe is used in the testing for a long term, which can meet the requirements of long lifespan for testing, good firmness, high current transmission effect and stability of low resistance.

To achieve the aforementioned objectives, the following technical solutions are adopted in the present invention:

The present invention provides a probe head, which is applied in a probe assembly for electrical testing, wherein the probe head comprises at least one contact portion, a first body portion, a second body portion and a third body portion that are stacked and connected to each other in sequence; the contact portion has a size decreasing in a direction away from the first body portion, the contact portion is used to contact an object to be tested; the first body portion is located between the contact portion and the second body portion, the first body portion has a radial size greater than those of the second body portion and the third body portion;

the second body portion is located between the first body portion and the third body portion, a periphery of the second body portion is configured by at least one second concave wall and at least one second boundary wall jointly surrounding the second body portion, the second concave wall has a radial size less than that of the second boundary wall so as to form a second inward concave space; the third body portion has a radial size equal to or less than that of the second boundary wall and larger than a smallest radial size of the second concave wall.

As one of the preferred embodiments, the first body portion, the second body portion and the third body portion each have a hardness equal to or less than 500 Vickers hardness.

As one of the preferred embodiments, the second concave wall has an opening with a size equal to or greater than 10 microns.

As one of the preferred embodiments, the second concave wall has a depth equal to or greater than 10 microns.

As one of the preferred embodiments, the second concave wall has a number of two or more, and at least one of the two or more second concave walls has an opening size different from that of other of the two or more second concave walls.

As one of the preferred embodiments, the second concave wall has a number of two or more, and a distance between adjacent second concave walls of the two or more second concave walls is equal to or greater than 10 microns.

As one of the preferred embodiments, the first body portion, the second body portion and the third body portion each is made of a material having a conductivity equal to or greater than 30% of that of an international annealed copper standard.

As one of the preferred embodiments, the material comprises at least one of the following elements: copper (Cu), silver (Ag), gold (Au), carbon (C), platinum (Pt), palladium (Pd), tungsten (W), aluminum (Al), tin (Sn), rhodium (Rh), iridium (Ir), indium (In) and ruthenium (Ru).

As one of the preferred embodiments, the contact portion, the first body portion, the second body portion and the third body portion of the probe head stacked together are manufactured by a micro-electromechanical process.

As one of the preferred embodiments, the first body portion is a circular column.

As one of the preferred embodiments, the first body portion is a polygonal column, a periphery of the first body portion is configured by at least one first boundary wall and at least one first concave wall jointly surrounding the first body portion, the first concave wall has a radial size less than that of the first boundary wall so as to form a first inward concave space.

As one of the preferred embodiments, the third body portion is a circular column.

As one of the preferred embodiments, the third body portion is a polygonal column, a periphery of the third body portion is configured by at least one third boundary wall and at least one third concave wall jointly surrounding the third body portion, the third concave wall has a radial size less than that of the third boundary wall so as to form a third inward concave space, the third boundary wall has a radial size greater than a radial size of the second concave wall.

As one of the preferred embodiments, the probe head further comprises a fourth body portion, the third body portion is located between the second body portion and the fourth body portion, the fourth body portion has an outer diameter equal to or less than that of the third body portion.

As one of the preferred embodiments, the fourth body portion is a circular column, the fourth body portion has a radial size greater than that of the smallest radial size of the second concave wall or a smallest radial size of the third concave wall.

As one of the preferred embodiments, the fourth body portion is a polygonal column, a periphery of the fourth body portion is configured by at least one fourth boundary wall and at least one fourth concave wall jointly surrounding the fourth body portion, the fourth concave wall has a radial size less than that of the fourth boundary wall so as to form a fourth inward concave space, the fourth boundary wall has a radial size greater than a radial size of the third concave wall, and the fourth boundary wall and the third concave wall are located at a same axial position.

The present invention also provides a probe assembly, comprising: the probe head and a pipe docked thereto, wherein the pipe has an accommodating space therein, the probe head is caught at an opening of the pipe by the first body portion, the second body portion and the third body portion are located in the accommodating space, the pipe has at least one protruding portion protruding toward inside of the pipe, the protruding portion is partially caught in a space defined by the second concave wall, such that the probe head and the pipe are prevented from being separated from each other.

As one of the preferred embodiments, the protruding portion has a number of two or more, and at least one of the two or more protruding portions has a protruding portion height toward inside of the pipe different from that of other of the two or more protruding portions.

As one of the preferred embodiments, the second body portion and the third body portion each have an outer diameter less than or equal to an inner diameter of the pipe.

As one of the preferred embodiments, the second concave wall has a number greater than or equal to that of the protruding portion.

As one of the preferred embodiments, the fourth body portion has an outer diameter less than or equal to an inner diameter of the pipe.

As one of the preferred embodiments, the protruding portion is caught in a space defined by the third concave wall.

As one of the preferred embodiments, a total number of the second concave wall and the third concave wall is greater than or equal to that of the protruding portion.

The present invention also provides a spring probe structure, comprising: the probe head and the pipe; a movable plunger, which is disposed in the accommodating space of the pipe, and the plunger has a pin portion with a smaller size such that the pin portion can reach out of the pipe while the plunger is limited to be movable inside the pipe and prevented from being separated from the pipe; and an elastic member which is a compressible spring, the elastic member is disposed in the accommodating space, and both ends of the elastic member contact the plunger and the probe head, respectively.

Compared with the prior art, in the probe head and probe assembly including the same of the present invention, the micro-electro-mechanical process is adopted to fabricate the planar structure designed as inward concave shape, and the probe head is formed by vertically stacking multiple layers, such that in addition that the probe head has a contact portion with high hardness and respective body portions with high conductivity, larger attachment area between respective body portions can also be provided to improve the structural strength of the probe head, which can improve the assembly yield of the probe head and the pipe when the probe head is miniaturized. Subsequently, an external force is utilized to form the protruding portion on the pipe and catch the protruding portion in the space defined by the second concave wall. Compared with the conventional catching method, the limited space due to the inward concave design can achieve an excellent tightening effect, an excellent firmness between the pipe and the probe head can be achieved. Thereafter, the micro-electromechanical probe joint and the pipe are combined to assemble a spring probe with a micro-electromechanical probe head, which has performance of high hardness, long lifespan for testing, stable structure and stability of low resistance during testing, and can meet the current requirement for miniaturization of the probe.

DETAILED DESCRIPTION OF THE PREFERRED EMBODIMENT

Figure 1:
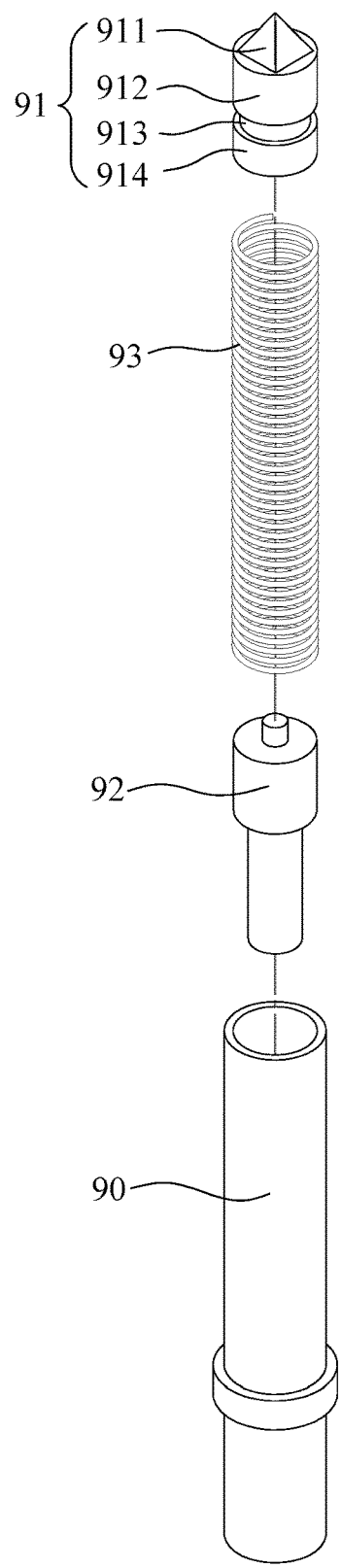
FIG. 1 is an exploded diagram of a conventional spring probe.

The technical solutions of the present invention will be clearly and completely described below in conjunction with specific embodiments and accompanying drawings. It should be noted that when an element is referred to as being "mounted on or fixed on" another element, it means that it may be directly located on the other element or an intervening element can be presented. When an element is referred to as being "connected" to another element, it means that it may be directly connected to the other element or an intervening element can be presented. "Axial" refers to the direction of the central axis of the element. "Radial" refers to the direction perpendicular to the central axis of the element. In the illustrated embodiments, "Outer diameter" is the diameter passing through the central axis of the component. Directions represented by up, down, left, right, front and rear, etc. are relative, and are used to explain that the structure and movement of different elements are relative in the present invention. These representations are appropriate when the components are located in the positions shown in the drawings. However, if the description of the position of elements changes, these representations are considered to change accordingly.

Unless otherwise defined, all technical and scientific terms used herein have the same meaning as commonly understood by those skilled in the art. The terms used herein is for the purpose of describing specific embodiments only but is not intended to limit the present invention. As used herein, the term "and/or" includes any and all combinations of one or more related listed items.

Figure 2:
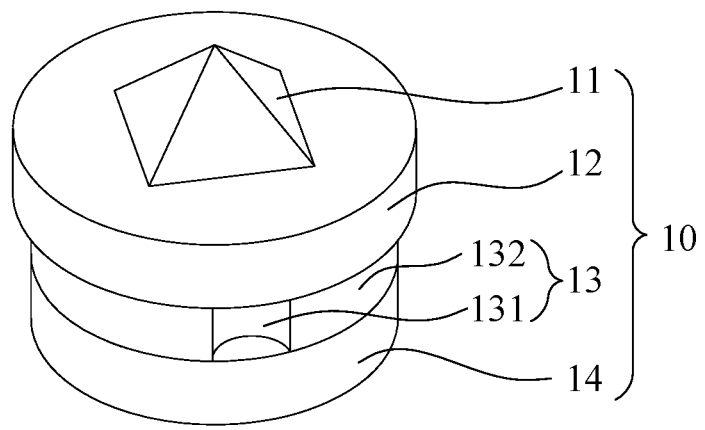
FIG. 2 is a perspective view of a probe head of a first embodiment of the present invention.
Figure 3:
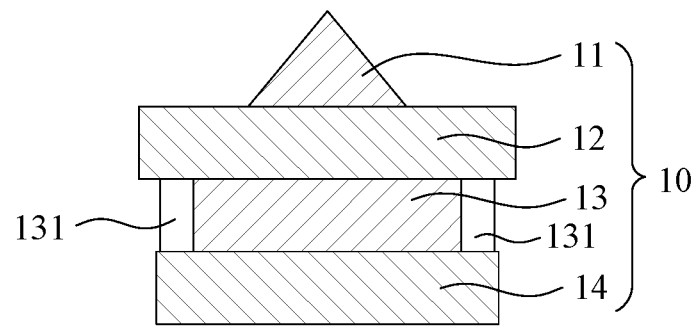
FIG. 3 is a cross-sectional view of the probe head of the first embodiment of the present invention.

As shown in FIGS. 2 and 3, which are a perspective view and a cross-sectional view of the probe head of the first embodiment of the present invention, respectively. The probe head 10 comprises at least one contact portion 11, a first body portion 12, a second body portion 13 and a third body portion 14 that are stacked and connected to each other in sequence. The contact portion 11 has a size decreasing in a direction away from the first body portion 12. The contact portion 11 has a terminal for contacting an object to be tested. The first body portion 12 is located between the contact portion 11 and the second body portion 13. The first body portion 12 has a radial size greater than those of the second body portion 13 and the third body portion 14. The second body portion 13 is located between the first body portion 12 and the third body portion 14. A periphery of the second body portion 13 is configured by at least one second concave wall 131 and at least one second boundary wall 132 jointly surrounding the second body portion 13. In a preferred embodiment, the periphery of the second body portion 13 is configured by at least two second concave walls 131 and at least two second boundary walls 132, which are alternatively arranged and jointly surround the second body portion 13; the second concave wall 131 has a radial size less than that of the second boundary wall 132 so as to form a second inward concave space; this inward concave space has the function of correcting the position of a protruding portion 22. The third body portion 14 has a radial size equal to or less than that of the second boundary wall 132 and larger than a smallest radial size of the second concave wall 131. As can be seen in FIG. 2, the second inward concave space formed by the second concave wall 131 extends from the first body portion 12 to the third body portion 14.

Figure 4:
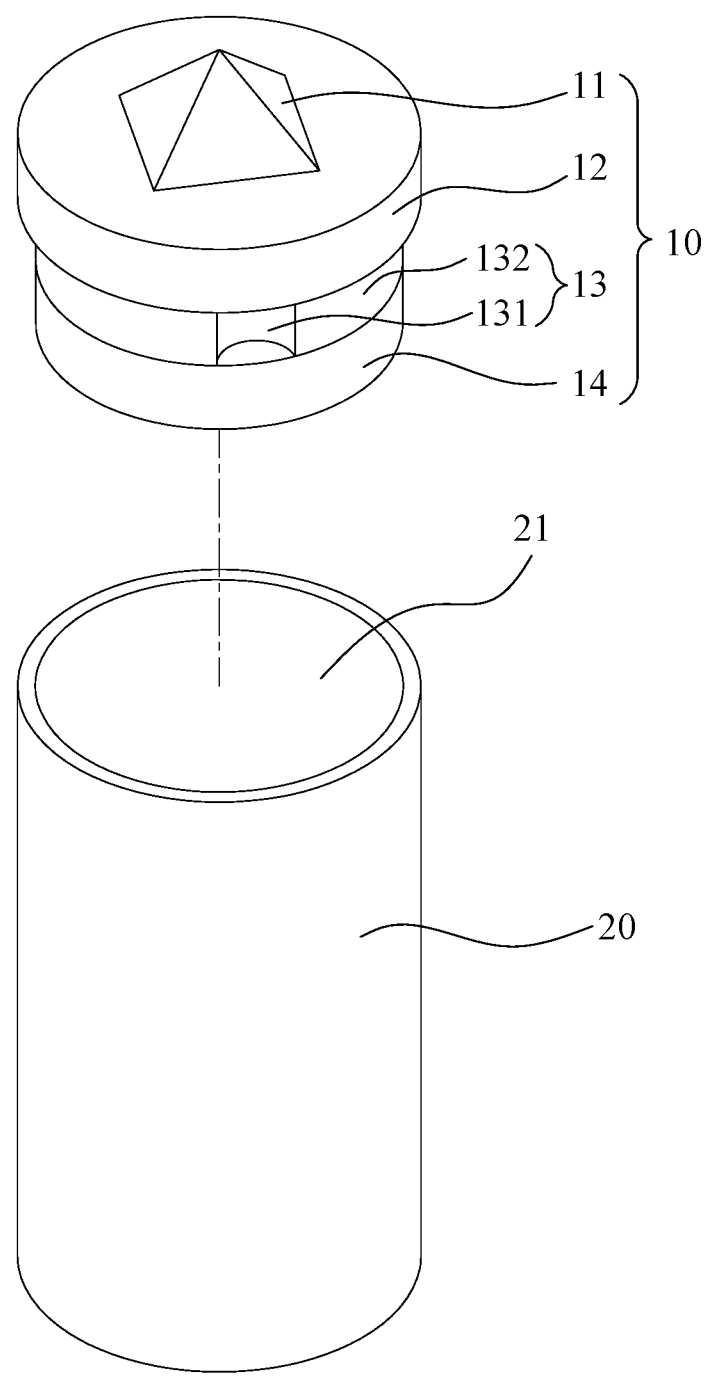
FIG. 4 is an exploded view of a probe assembly of the present invention.
Figure 5A:
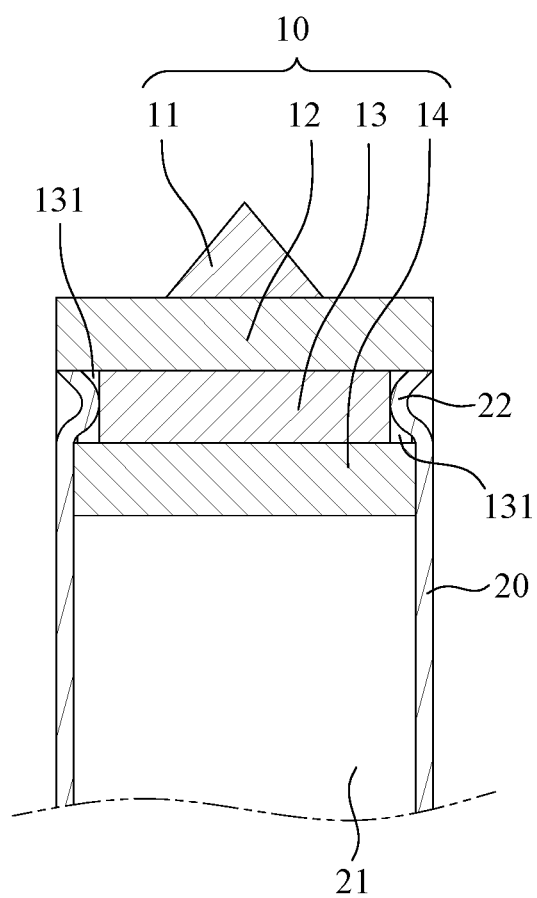
FIG. 5A is a longitudinal cross-sectional view of the probe assembly of the present invention.
Figure 5B:
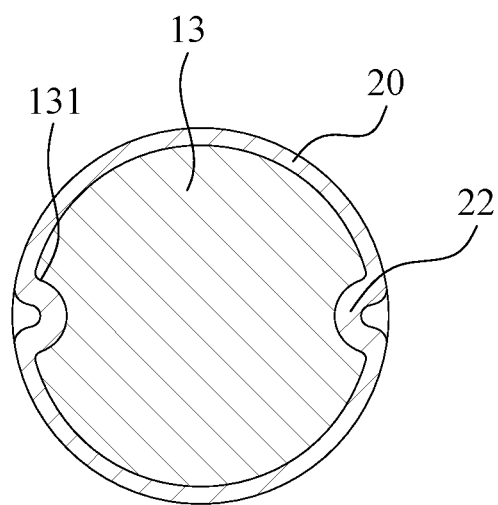
FIG. 5B is a transverse cross-sectional view of a second body portion the probe assembly of the present invention.

As shown in FIG. 4, which is an exploded view of a probe assembly of the present invention. The probe assembly of the present invention comprises the probe head 10 and a pipe 20 docked thereto. The pipe 20 has an accommodating space 21 therein. When assembling, the accommodating space 21 provides a space for the second body portion 13 and the third body portion 14 to be placed therein, the first body portion 12 is caught at an opening of the pipe 20, so as to ensure that the pipe 20 and respective parts of the probe head 10 are located in correct positions. As shown in FIGS. 5A and 5B, thereafter, an external force is applied on the outer wall of the pipe 20 to form at least one protruding portion 22 protruding toward inside of the pipe 20. Each protruding portion 22 is partially located in a space defined by the corresponding second concave wall 131, such that the protruding portion 22 is partially "embed" into the second concave wall 131, and a "clamping" effect is acted on upper, lower, left and right sides of the protruding portion 22 due to the limited area of the second concave wall 131. In more detail, the protruding portion 22 is partially fixed in the up-and-down direction by the first body portion 12 or the third body portion 14, and is also wrapped laterally by the space defined by the second concave wall 131 at the same time. Furthermore, since the second inward concave space has the function of correcting the position of the protruding portion 22, even if the position where the protruding portion 22 initially formed is not at the relative center of the second inward concave space, the finally formed protruding portion 22 will be located in the second concave wall 131 due to the design of the second inward concave space, thereby achieving a good catching effect. In this way, the probe head 10 and the pipe 20 can be prevented from being separated from each other, and this inward concave structural design can provide better firm strength with the pipe 20, which facilitates the improvement of the assembly yield of miniaturized probes in the future. Furthermore, when the protruding portion 22 has a number of two or more, at least one of the two or more protrusions 22 can have a protrusion height toward inside of the pipe different from that of other of the two or more protrusions 22. The present invention subsequently provides a variety of different implementations of the probe head 10, and all of these probe heads 10 can be combined with the pipe 20 to assemble a probe assembly.

Hereinafter, respective components of the present invention are described in detail, as shown in FIGS. 2 and 3:

The probe head 10 of the present invention comprises the contact portion 11, the first body portion 12, the second body portion 13 and the third body portion 14 stacked in sequence, and this structure is manufactured by micro-electromechanical systems (MEMS) process, wherein the contact portion 11 is firstly formed, then the first body portion 12 is integrally formed on the contact portion 11, and then the second body portion 13 is also integrally formed on the first body portion 12, and finally the third body portion 14 is also integrally formed on the second body portion 13. In the present invention, a predetermined pattern is firstly formed on the substrate by etching through a semiconductor process, then corresponding conductive materials are deposited in sequence, after repeating the steps many times, the shapes of respectively body portions are formed. During the procedure, the first body portion 12, the second body portion 13 and the third body portion 14 with desired axial sizes are obtained by controlling the deposition time. Finally, excess materials are removed to form the structure of the probe head 10 of the present invention.

Figure 6:
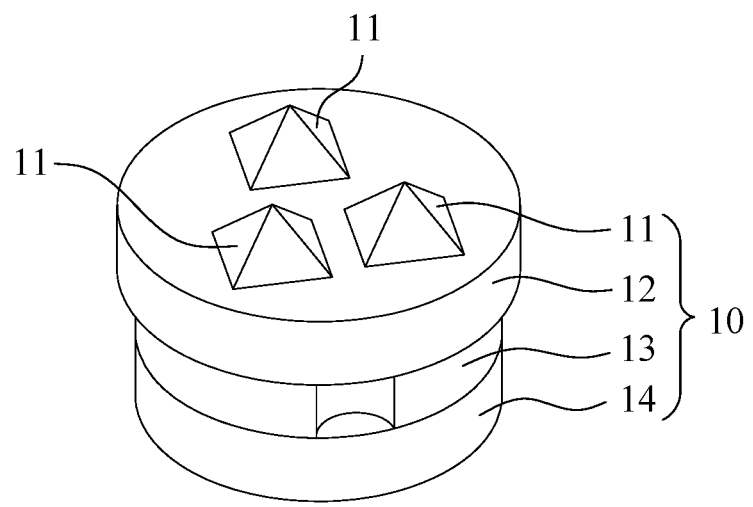
FIG. 6 is a view illustrating a contact portion of a probe head of another embodiment of the present invention.
Figure 7:
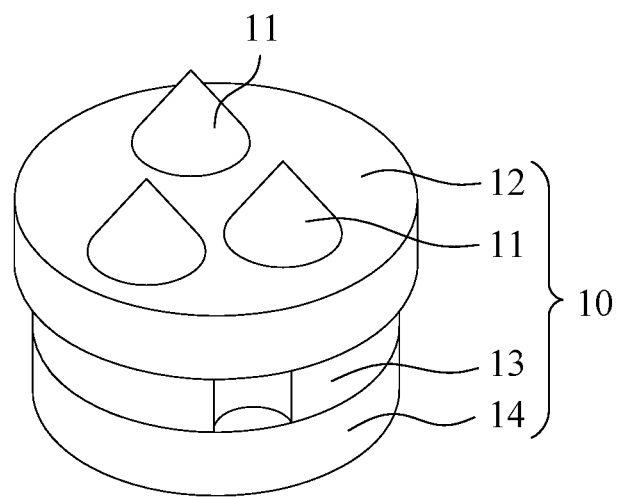
FIG. 7 is a view illustrating a contact portion of a probe head of still another embodiment of the present invention.

Although the contact portion 11, the first body portion 12, the second body portion 13 and the third body portion 14 are all made of materials with good electrical conductivity, their materials do not need to be exactly the same. The contact portion 11 is responsible for repeatedly contacting the object to be tested during electrical testing, and is made of a relatively hard material with good wear resistance, such as nickel or nickel alloys, and the nickel alloy contains nickel and at least one alloying element selected from a group consisting of iron (Fe), tungsten (W), copper (Cu), boron (B), phosphorus (P), carbon (C), cobalt (Co), silver (Ag), manganese (Mn), palladium (Pd) and rhodium (Rh). The contact portion 11 has a shape with a size gradually decreasing in a direction away from the first body portion 12, and the shape can be conical, quadrilateral pyramid, or polygonal three-dimensional oblique cone. In this embodiment, the contact portion 11 has a number of only one, but it is not limited thereto, the number can be plural, as shown in FIGS. 6 and 7, wherein the contact portion 11 includes several quadrilateral pyramids in FIG. 6, and the contact portion 11 includes several conical shape structures in FIG. 7. When the contact portion 11 has a number of one, the height thereof is less than 525 microns, and the maximum radial size of the tip of the contact portion 11 is less than 25 microns. In addition, when the contact portion 11 has a number of plural, the distance between them is at least 10 microns. In addition, the contact portion 11 can also be made of palladium or palladium alloy materials with moderate wear resistance and low resistance, and the palladium alloy contains palladium (Pd) and at least one alloying element selected from a group consisting of nickel (Ni), copper (Cu), cobalt (Co), molybdenum (Mo), silver (Ag), Indium (In), manganese (Mn) and carbon (C).

The first body portion 12, the second body portion 13 and the third body portion 14 are is-made of a material having a conductivity equal to or greater than 30% of that of an international annealed copper standard (IACS), and the material includes a material of at least one of the following elements: copper (Cu), silver (Ag), gold (Au), carbon (C), platinum (Pt), palladium (Pd), tungsten (W), aluminum (Al), tin (Sn), rhodium (Rh), iridium (Ir), indium (In) and ruthenium (Ru). The first body portion 12, the second body portion 13 and the third body portion 14 each have a hardness equal to or less than 500 Vickers hardness. In addition, the probe head 10 of the present invention is a miniaturized probe, so that the first body portion 12 has a radial size less than 700 microns, and when being stacked together, the total axial size of the first body portion 12, the second body portion 13 and the third body portion 14 is less than 1000 microns.

In addition, for the convenience of assembly, there are also corresponding limitations in the size and shape of respective parts of the probe head 10. As shown in FIGS. 2 to 4, in the probe head of the first embodiment, the first body portion 12 is a circular column; the first body portion 12 has an outer diameter greater than those of the second body portion 13 and the third body portion 14, and greater than the inner diameter of the pipe 20; the second body portion 13 is a circular column, a periphery of the second body portion 13 is configured by at least two second concave walls 131 and at least two second boundary walls 132 jointly surrounding the second body portion 13; and the outer diameter of the second boundary wall 132 is exactly the outer diameter of the second body portion 13. The second concave wall 131 has a radial size less than that of the second boundary wall 132 so as to form a second inward concave space. In this embodiment, the second concave walls 131 are arranged at intervals of 180 degrees, only one of them can be seen in FIG. 2, while both of them can be seen FIG. 3 because the view angle is adjusted to different positions. Since the second concave wall 131 is matched with the protruding portion 22 of the pipe 20, in order to improve the firmness after processing and assembly, the second concave wall 131 has an opening with a size equal to or greater than 10 microns, the second concave wall 131 has a depth equal to or greater than 10 microns, and the second body portion 13 has a axial size of at least 10 microns. The third body portion 14 is a circular column, the third body portion 14 has an outer diameter equal to or less than that of the second boundary wall 132, and the outer diameter of the third body portion 14 is greater than a minimum radial size of the second concave wall 131, so as to prevent the protruding portion 22 from sliding out of the second body portion 13 after assembly. The second body portion 13 and the third body portion 14 each have an outer diameter less than or equal to an inner diameter of the pipe 20.

The probe head 10 of the present invention is manufactured by micro-electromechanical systems (MEMS) process, wherein different patterns are formed by etching, then corresponding conductive materials are deposited in sequence, such that respectively portions of the probe head 10 can be formed in different shapes, the different shapes provide relative convenience in assembly or alignment. To this end, the present invention provides the following several different embodiments for illustration.

Figure 8:
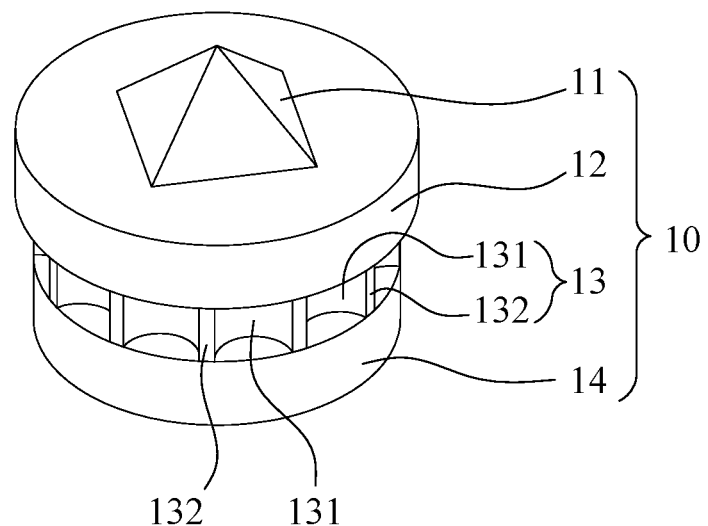
FIG. 8 is a perspective view of a probe head of a second embodiment of the present invention.

As shown in FIG. 8, which is a perspective view of a probe head of a second embodiment of the present invention. The probe head 10 in this this embodiment is similar to that of the first embodiment, except for the shape of the second body portion 13. In this embodiment, the second body portion 13 is a polygonal column, a periphery of the second body portion 13 is configured by several second concave walls 131 and several second boundary walls 132, which are alternatively arranged and jointly surround the second body portion 13. Since in this embodiment, there are several second concave walls 131 which are arranged at intervals in an equiangular manner at the periphery of the second body portion 13, due to the larger number of the second inward concave spaces, when the pipe 20 forms the protruding portion 22, the protruding portion 22 can be easily caught in the space defined by one of the second concave walls 131, which can reduce the difficulty of assembly and improve the assembly yield. Furthermore, although in this embodiment, the several concave walls 131 have the same shape and are arranged at intervals in an equiangular manner at the periphery of the second body portion 13, it is not limited thereto. That is, the second concave wall 131 has a number of two or more, and at least one of the two or more second concave walls 131 has an opening size different from that of other of the two or more second concave walls 131. The second concave wall 131 has a number of two or more, and a distance between adjacent second concave walls 131 of the two or more second concave walls 131 is equal to or greater than 10 microns.

Figure 9:
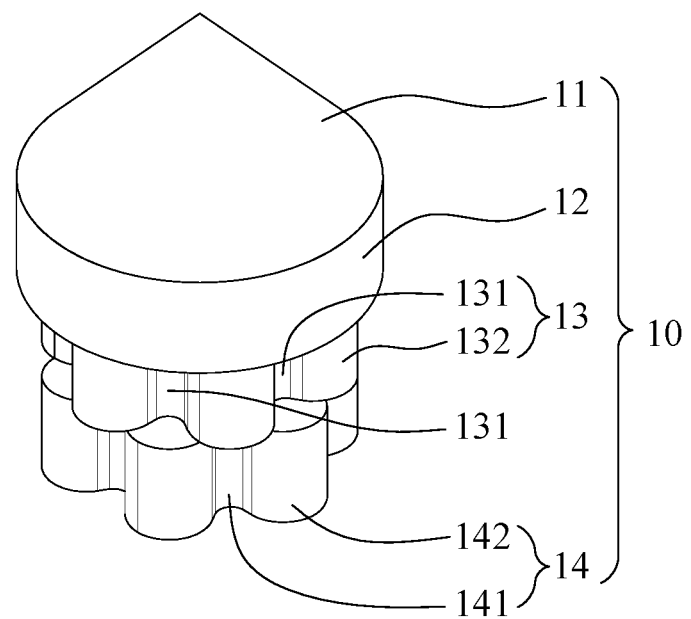
FIG. 9 is a perspective view of a probe head of a third embodiment of the present invention.

As shown in FIG. 9, which is a perspective view of a probe head of a third embodiment of the present invention. The probe head 10 still comprises the contact portion 11, the first body portion 12, the second body portion 13 and the third body portion 14. In this embodiment, the contact portion 11 is in a conical shape and having a larger size. The first body portion 12 is a circular column. The second body portion 13 is a polygonal column, and is surrounded by alternatively arranged several second concave walls 131 and several second boundary walls 132. In this embodiment, the second boundary wall 132 has arc-shaped surface and is connected to the second concave wall 131 tapered from outside to inside. Therefore, it can be seen that the shape of the second body portion 13 of the present invention can be changed in many variations, and is not limited to specific types. In addition, the third body portion 14 is a polygonal column, and is surrounded jointly by several third concave walls 141 and several third boundary walls 142. The third boundary wall 142 also has arc-shaped surface and is connected to the third concave wall 141 tapered from outside to inside. Furthermore, the third boundary wall 142 is located at the same axial position as the second concave wall 131, the purpose of which is to confine the protruding portion 22 within the space defined by the second concave wall 131 when assembling.

Figure 10A:
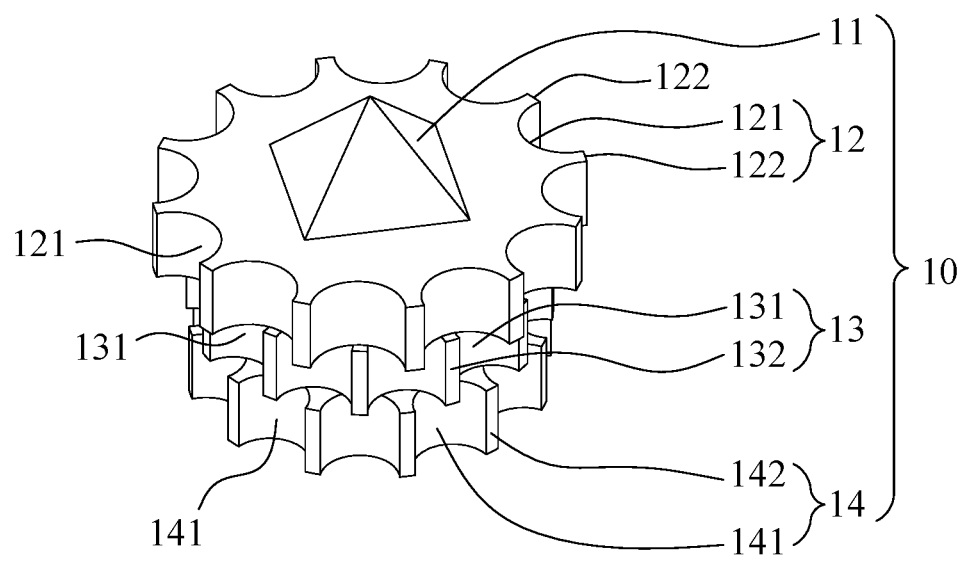
FIG. 10A is a perspective view of a probe head of a fourth embodiment of the present invention.
Figure 10B:
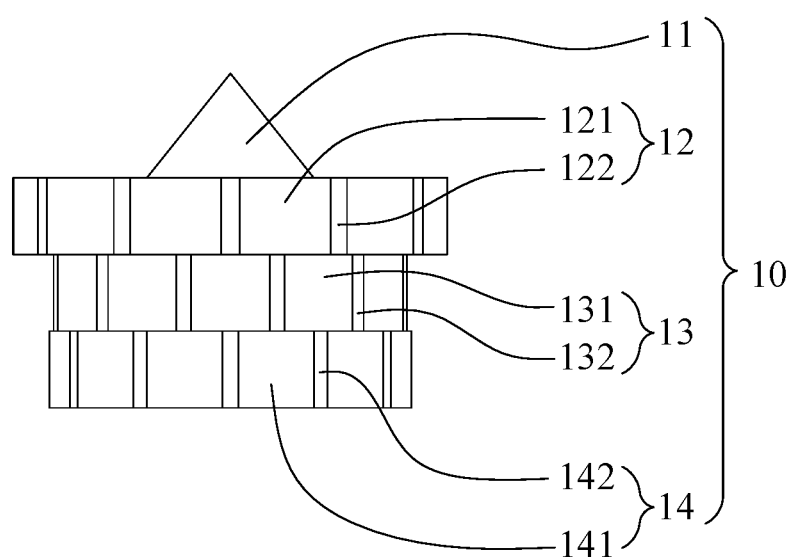
FIG. 10B is a side view of a probe head of the fourth embodiment of the present invention.

As shown in FIGS. 10A and 10B, which are a perspective view and a side view of the probe head of the fourth embodiment of the present invention, respectively. In this embodiment, the first body portion 12, the second body portion 13 and the third body portion 14 of the probe head 10 are all in polygonal shapes. The first body portion 12 is a polygonal column, a periphery of the first body portion 12 is configured by several first concave walls 121 and several first boundary walls 122, which are alternatively arranged and jointly surround the first body portion 12. The outer diameter of the first boundary wall 122 is exactly the outer diameter of the first body portion 12. The first concave wall 121 is in an inward concave shape, and has a radial size less than that of the first boundary wall 122. The periphery of the second body portion 13 is configured by several second concave walls 131 and several second boundary walls 132, which are the same as those in the embodiment shown in FIG. 8, so that details will not be described below. The third body portion 14 is a polygonal column, a periphery of the third body portion 14 is configured by several third concave walls 141 and several third boundary walls 142, which are alternatively arranged and jointly surround the third body portion 14. The outer diameter of the third boundary wall 142 is exactly the outer diameter of the third body portion 14. The third concave wall 141 is in an inward concave shape, and has a radial size less than that of the third boundary wall 142. In this embodiment, the first boundary wall 122 and the third boundary wall 142 are located at both sides in axial direction of the second concave wall 131, the purpose of which is to confine the protruding portion 22 within the second concave wall 131 when assembling.

In the embodiments shown in FIGS. 9, 10A and 10B, the several second concave walls 131 of the second body portion 13 and the several third concave walls 141 of the third body portion 14 form second and third inward concave spaces which are alternatively arranged and located in different axial positions. The protruding portion 22 arranged in the horizontal direction can limit the relative movement between the probe head 10 and the pipe 20, so as to prevent the probe head 10 from being separated from the pipe 20 after assembly.

In the above embodiments, the number of the first concave wall 121 is several, but it is not limited thereto, and the number may be one, or two or more. At least one of the two or more first concave walls 121 has a shape different that of other of the two or more first concave walls 121. At this time, the shape of the first concave wall 12 can be used for positioning, which facilitates the use of Automated Optical Inspection (AOI) for image recognition of graphic discrimination, and the use of an equipment to automatically pick and place objects, thereby the picking, placement, and alignment and docking of the probe head 10 can be performed more accurately and quickly, which meets the requirements of the present invention for automatic production.

In the above embodiment, the body portion of the probe head 10 is composed of the first body portion 12, the second body portion 13 and the third body portion 14, wherein the axial thickness of respective body portions may be the same or different, which can be freely selected or changed by the designer according to needs. For example, the second body portion 13 is responsible for catching the protruding portion 22, so that the second body portion 13 may have an axial size greater than that of the first body portion 12 or the third body portion 14, which is of course not limited thereto, and may be implemented as other embodiments.

Figure 11:
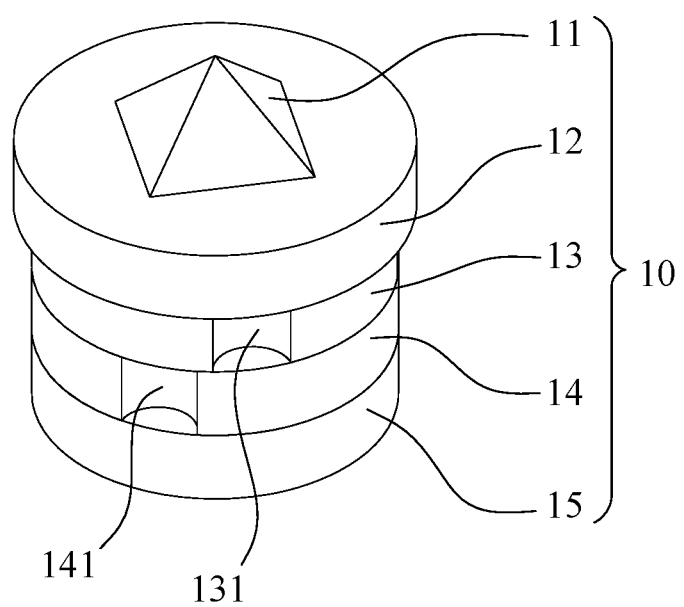
FIG. 11 is a perspective view of a probe head of a fifth embodiment of the present invention.

As shown in FIG. 11, which is a perspective view of a probe head of a fifth embodiment of the present invention. In this embodiment, the probe head 10 comprises the contact portion 11, the first body portion 12, the second body portion 13, the third body portion 14 and a fourth body portion 15, wherein the first body portion 12, the second body portion 13 and the third body portion 14 are the same as the above embodiments, and can be circular columns or polygonal columns, so that details will not be described below. In this embodiment, the fourth body portion 15 has an outer diameter equal to or less than that of the third body portion 14. In this embodiment, the periphery of the second body portion 13 includes at least one second concave wall 131, the periphery of the third body portion 14 includes at least one third concave wall 141, the second concave wall 131 and the third concave wall 141 are not located at a same axial position and are alternatively arranged, and the radial size of the fourth body portion 15 is larger than a smallest radial size of the third concave wall 141, and may be also larger than a smallest radial size of the second concave wall 131. This embodiment is advantageous in that: since the non-coaxial inward concave spaces are alternatively arranged, in addition that the protruding portion 22 arranged in the horizontal direction can limit the relative movement between the probe head 10 and the pipe 20, so as to prevent the probe head 10 from being separated from the pipe 20 after assembly, inward concave spaces located at different height in the vertical direction are also provided, such that when assembling, the pipe 20 can form protruding portions 22 at different height in the vertical direction, these protruding portions 22 can be located in the spaces defined by the second concave walls 131 or the third concave walls 141, thereby improving the firmness after assembly, and the following embodiments all have the same advantages.

Figure 12:
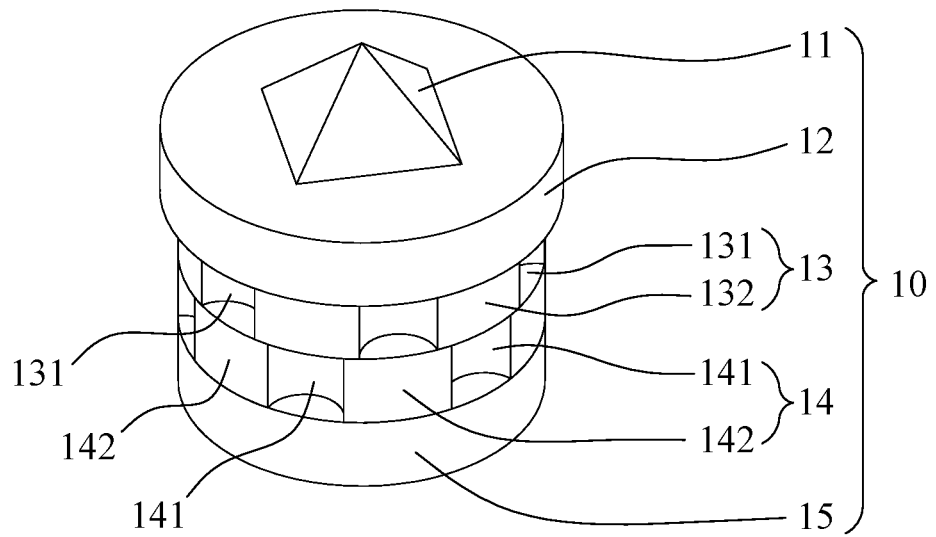
FIG. 12 is a perspective view of a probe head of a sixth embodiment of the present invention.

As shown in FIG. 12, which is a perspective view of a probe head of a sixth embodiment of the present invention. This embodiment is similar to the above embodiments, except for the shape of the second body portion 13 and the third body portion 14. In this embodiment, the second body portion 13 includes two or more second concave walls 131, third body portion 14 also includes two or more third concave walls 141, and the second concave walls 131 and the third concave walls 141 are not located at a same axial position. As such, when the second body portion 13, the third body portion 14 and the fourth body portion 15 of the probe head 10 are inserted into the accommodating space 21 of the pipe 20, an external force can be applied on the outer wall of the pipe 20, thereby forming at least two protruding portions 22 arranged in the horizontal and vertical directions in the pipe 20. These protruding portions 22 can be located at the positions corresponding to the second concave walls 131 or the third concave walls 141, thereby increasing the firmness between the pipe 20 and the probe head 10. In this embodiment, after assembly, the number of the protruding portions 22 can be less than or equal to the total number of the second concave walls 131 and the third concave walls 141.

Figure 13:
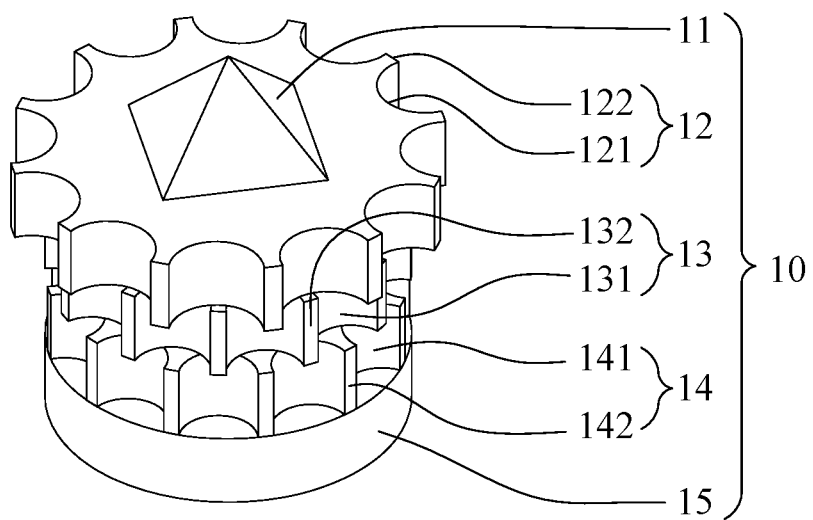
FIG. 13 is a perspective view of a probe head of a seventh embodiment of the present invention.

As shown in FIG. 13, which is a perspective view of a probe head of a seventh embodiment of the present invention. In this embodiment, the first body portion 12, the second body portion 13 and the third body portion 14 of the probe head 10 are all polygonal columns, while the fourth body portion 15 is a circular column. The periphery of the first body portion 12 is configured by several first concave walls 121 and several first boundary walls 122 jointly surrounding the first body portion 12. The periphery of the second body portion 13 is configured by several second concave walls 131 and several second boundary walls 132 jointly surrounding the second body portion 13. The periphery of the third body portion 14 is configured by several third concave walls 141 and several third boundary walls 142 jointly surrounding the third body portion 14. Wherein, the first boundary wall 122 has an outer diameter greater than those of the second boundary wall 132 and the third boundary wall 142, the second boundary walls 132 and the third boundary walls 142 are not located at a same axial position, and the fourth body portion 15 has a radial size greater than a smallest radial size of the third concave wall 141. This method is similar to the above embodiments in that the effect of fixing the probe head 10 and the pipe 20 at multiple points can be achieved after assembly.

Figure 14:
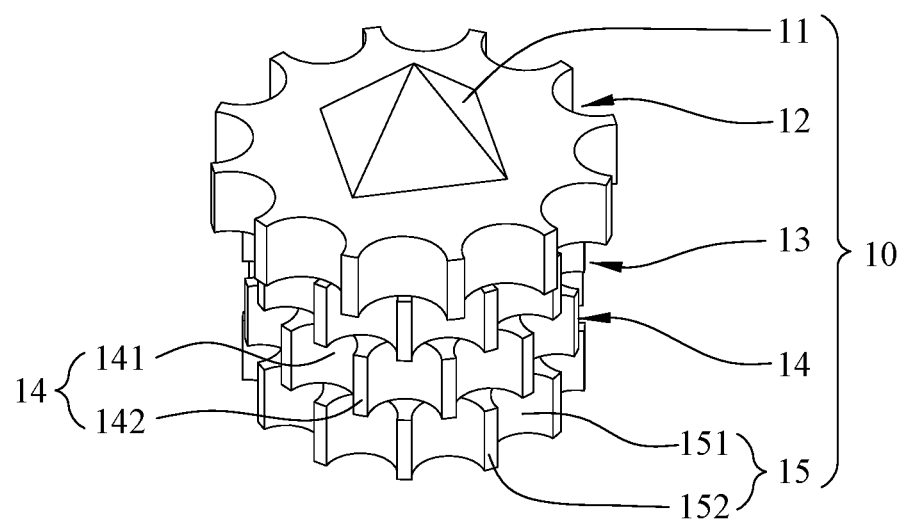
FIG. 14 is a perspective view of a probe head of an eighth embodiment of the present invention.

As shown in FIG. 14, which is a perspective view of a probe head of a eighth embodiment of the present invention. This embodiment is similar to the seventh embodiment, except for the shape of the fourth body portion 15. In this embodiment, the fourth body portion 15 is a polygonal column, a periphery of the fourth body portion 15 is configured by several fourth concave walls 151 and several fourth boundary walls 152, which are alternatively arranged and jointly surround the fourth body portion 15. The outer diameter of the fourth boundary wall 152 is exactly the outer diameter of the fourth body portion 15. The fourth concave wall 151 has a radial size less than that of the fourth boundary wall 152 so as to form a fourth inward concave space. The fourth boundary wall 152 and the third concave wall 141 are located at a same axial position. The fourth boundary wall 152 has a radial size greater than a smallest radial size of the third concave wall 141.

In summary, the probe assembly of the present invention is assembled from the probe head 10 and the pipe 20, wherein the probe head 10 is manufactured by the micromechanical process and can have a shape as described in the above various embodiments. In the present invention, the micro-electro-mechanical process is adopted to fabricate the inward concave structure of the second concave wall 131 of the second body portion 13, and the probe head 10 is formed by vertically stacking multiple layers, such that in addition that the probe head 10 has a contact portion with high hardness and respective body portions with high conductivity, larger attachment area between respective body portions can also be provided to improve the structural strength of the probe head 10, which can improve the assembly yield of the probe head 10 and the pipe 20 when the probe head 10 is miniaturized. Subsequently, an external force is utilized to form the protruding portion 22 on the pipe 20 and catch the protruding portion 22 in the space defined by the second concave wall 131. Compared with the conventional catching method, the limited space due to the inward concave design can achieve an excellent tightening effect, and the probe head 10 can also have multiple inward concave spaces arranged in the vertical direction, such that the number of the protruding portion 22 can be increased in the vertical direction during the assembly with the pipe 20, thereby forming at least two or several protruding portions 22 arranged in horizontal and vertical directions in the pipe 20 and catching the protruding portions 22 in the space defined by the second concave walls 131 or the third concave walls 141 at the corresponding positions. As such, an excellent firmness between the pipe 20 and the probe head 10 can be achieved. This assembly can be completed with the help of automated machinery, which greatly reduces the cost and difficulty of assembly, and can improve product yield, meeting the production requirements of the probe assembly.

Figure 15:
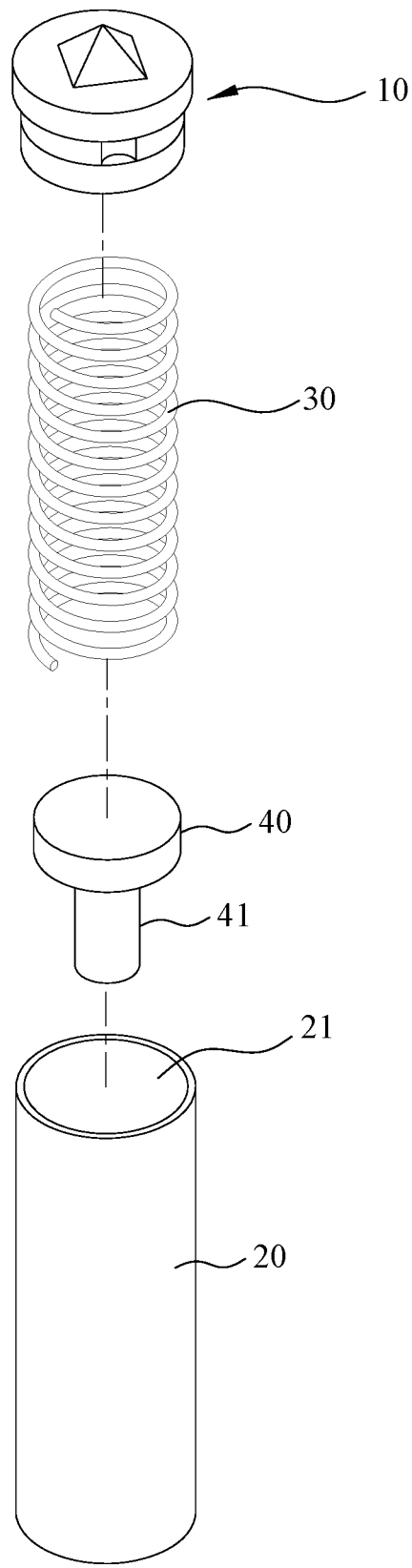
FIG. 15 is an exploded diagram of a spring probe of the present invention.

As shown in the exploded view of FIG. 15, which shows that the probe assembly of the present invention can also be applied in a spring probe structure, wherein the spring probe includes the probe head 10, the pipe 20, an elastic member 30 and a movable plunger 40. The accommodating space 21 of the pipe 20 provides a space for the plunger 40 to be inserted therein, and the plunger 40 has a pin portion 41 with a less size such that the pin portion 41 can reach out of the pipe 20 while the plunger 40 is limited to be only movable by a short distance inside the pipe 20 and prevented from being separated from the accommodating space 21 from bottom. The elastic member 30 is a compressible spring, when the elastic member 30 is disposed in the accommodating space 21, both ends of the elastic member 30 contact the plunger 40 and the probe head 10, respectively. When the plunger 40 and the elastic member 30 are placed in the accommodating space 21, the probe head 10 is partially inserted into the pipe 20, and an external force is applied on the pipe 20, thereby the protruding portion 22 is formed and caught in the space defined by the second concave wall 131, which is exactly in the state that the pipe 20 is closed and the overall structure is fixed. During testing, a plurality of the spring probes are mounted on a test platform (not shown), at both ends thereof, the probe head 10 contacts an object to be tested, and the plunger 40 is electrically connected to the corresponding circuit on the circuit board, respectively to carry out the required testing operations.

The above described are only preferred embodiments of the present invention, and are not intended to limit the scope of the embodiments of the present invention. That is, all equivalent changes and modifications made according to the claims of the present invention are covered by the claimed scope of the present invention.

What is claimed is:

1. A probe head, which is applied in a probe assembly for electrical testing, wherein the probe head comprises at least one contact portion, a first body portion, a second body portion and a third body portion that are stacked and connected to each other in sequence; the at least one contact portion has a size decreasing in a direction away from the first body portion, the at least one contact portion is used to contact an object to be tested; the first body portion is located between the at least one contact portion and the second body portion, the first body portion has a radial size greater than those of the second body portion and the third body portion; the second body portion is located between the first body portion and the third body portion, a periphery of the second body portion is configured by at least one second concave wall and at least one second boundary wall jointly surrounding the second body portion, each of the at least one second concave wall defines a second inward concave space extending from the first body portion to the third body portion and has a radial size less than that of the at least one second boundary wall; the third body portion has a radial size equal to or less than that of the at least one second boundary wall and larger than a smallest radial size of the at least one second concave wall.

2. The probe head according to claim 1, wherein each of the first body portion, the second body portion and the third body portion has a hardness equal to or less than 500 Vickers hardness.

3. The probe head according to claim 1, wherein each of the at least one second concave wall has an opening with a size equal to or greater than 10 microns.

4. The probe head according to claim 1, wherein each of the at least one second concave wall has a depth equal to or greater than 10 microns.

5. The probe head according to claim 1, wherein the at least one second concave wall comprises two or more second concave walls, and at least one of the two or more second concave walls has an opening size different from that of the other one or more second concave walls.

6. The probe head according to claim 1, wherein the at least one second concave wall comprises two or more second concave walls, and a distance between adjacent second concave walls of the two or more second concave walls is equal to or greater than 10 microns.

7. The probe head according to claim 1, wherein each of the first body portion, the second body portion and the third body portion is made of a material having a conductivity equal to or greater than 30% of that of an international annealed copper standard, wherein the material comprises at least one of the following elements: copper (Cu), silver (Ag), gold (Au), carbon (C), platinum (Pt), palladium (Pd), tungsten (W), aluminum (Al), tin (Sn), rhodium (Rh), iridium (Ir), indium (In) and ruthenium (Ru).

8. The probe head according to claim 1, wherein the contact portion, the first body portion, the second body portion and the third body portion stacked together are manufactured by a micro-electromechanical process.

9. The probe head according to claim 1, wherein the first body portion is a circular column.

10. The probe head according to claim 1, wherein the first body portion is a polygonal column, a periphery of the first body portion is configured by at least one first boundary wall and at least one first concave wall jointly surrounding the first body portion, each of the at least one first concave wall has a radial size less than that of the at least one first boundary wall so as to form a first inward concave space.

11. The probe head according to claim 1, wherein the third body portion is a circular column.

12. The probe head according to claim 1, wherein the third body portion is a polygonal column, a periphery of the third body portion is configured by at least one third boundary wall and at least one third concave wall jointly surrounding the third body portion, each of the at least one third concave wall has a radial size less than that of the at least one third boundary wall so as to form a third inward concave space, the at least one third boundary wall has a radial size equal to or less than that of the at least one second boundary wall and larger than the smallest radial size of the at least one second concave wall.

13. The probe head according to claim 12, further comprising a fourth body portion, wherein the third body portion is located between the fourth body portion and the second body portion, and the fourth body portion has a radial size equal to or less than that of the third body portion.

14. The probe head according to claim 13, wherein the fourth body portion is a circular column, the fourth body portion has a radial size greater than that of the smallest radial size of the at least one second concave wall or a smallest radial size of the at least one third concave wall.

15. The probe head according to claim 13, wherein the fourth body portion is a polygonal column, a periphery of the fourth body portion is configured by at least one fourth boundary wall and at least one fourth concave wall jointly surrounding the fourth body portion, each of the at least one fourth concave wall has a radial size less than that of the at least one fourth boundary wall so as to form a fourth inward concave space, the at least one fourth boundary wall has a radial size greater than a smallest radial size of the at least one third concave wall, and the at least one fourth boundary wall and the at least one third concave wall are located at a same axial position.

16. A probe assembly, comprising:
a probe head includes at least one contact portion, a first body portion, a second body portion and a third body portion that are stacked and connected to each other in sequence; the at least one contact portion has a size decreasing in a direction away from the first body portion, the at least one contact portion is used to contact an object to be tested; the first body portion is located between the at least one contact portion and the second body portion, the first body portion has a radial size greater than those of the second body portion and the third body portion; the second body portion is located between the first body portion and the third body portion, a periphery of the second body portion is configured by at least one second concave wall and at least one second boundary wall jointly surrounding the second body portion, each of the at least one second concave wall defines a second inward concave space extending from the first body portion to the third body portion and has a radial size less than that of the at least one second boundary wall; the third body portion has a radial size equal to or less than that of the at least one second boundary wall and larger than a smallest radial size of the at least one second concave wall; and a pipe, wherein the probe head is docked with the pipe, the pipe has an accommodating space therein, the probe head is caught at an opening of the pipe by the first body portion, the second body portion and the third body portion are located in the accommodating space, the pipe has at least one protruding portion protruding toward inside of the pipe, the at least one protruding portion is partially caught in a space defined by the at least one second concave wall, such that the probe head and the pipe are prevented from being separated from each other.

17. The probe assembly according to claim 16, wherein the at least one protruding portion comprises two or more protruding portions, and at least one of the two or more protruding portions has a protrusion height toward inside of the pipe different from that of the other one or more protruding portions.

18. The probe assembly according to claim 16, wherein each of the second body portion and the third body portion has an outer diameter less than or equal to an inner diameter of the pipe.

19. The probe assembly according to claim 16, wherein the at least one second concave wall has a number of second concave walls greater than or equal to that of the at least one protruding portion.

20. The probe assembly according to claim 16, wherein the at least one second concave wall comprises two or more second concave walls, and at least one of the two or more second concave walls has an opening size different from that of the other one or more second concave walls.

21. The probe assembly according to claim 16, wherein a periphery of the third body portion is configured by at least one third boundary wall and at least one third concave wall jointly surrounding the third body portion, each of the at least one third concave wall has a radial size less than that of the at least one third boundary wall so as to form a third inward concave space, the at least one third boundary wall has a radial size equal to or less than that of the at least one second boundary wall and larger than the smallest radial size of the at least one second concave wall.

22. The probe assembly according to claim 16, further comprising a fourth body portion, wherein the third body portion is located between the fourth body portion and the second body portion, and the fourth body portion has a radial size equal to or less than that of the third body portion.

23. The probe assembly according to claim 22, wherein the fourth body portion has an outer diameter less than or equal to an inner diameter of the pipe.

24. The probe assembly according to claim 21, wherein each of the at least one protruding portion is partially caught in a space defined by the at least one third concave wall.

25. The probe assembly according to claim 21, wherein a total number of the at least one second concave wall and the at least one third concave wall is greater than or equal to that of the at least one protruding portion.

26. A spring probe structure, comprising:

the probe assembly according to claim 16;

a movable plunger, which is disposed in the accommodating space of the pipe, and the plunger has a pin portion with a size smaller than that of the pipe such that the pin portion can reach out of the pipe while the plunger is limited to be movable inside the pipe and prevented from being separated from the pipe; and an elastic member which is a compressible spring, the elastic member is disposed in the accommodating space, and both ends of the elastic member contact the plunger and the probe head, respectively.

* * * * *